United States Patent
Chang et al.

(10) Patent No.: US 11,688,573 B2
(45) Date of Patent: Jun. 27, 2023

(54) RELAY SAFETY SYSTEM AND ROBOTIC ARM CONTROLLER

(71) Applicant: HIWIN TECHNOLOGIES CORP., Taichung (TW)

(72) Inventors: Shun-Kai Chang, Taichung (TW); Yi-Hung Chen, Taichung (TW); Yen-Shun Huang, Taichung (TW)

(73) Assignee: HIWIN TECHNOLOGIES CORP., Taichung (TW)

( * ) Notice: Subject to any disclaimer, the term of this patent is extended or adjusted under 35 U.S.C. 154(b) by 143 days.

(21) Appl. No.: 17/481,905

(22) Filed: Sep. 22, 2021

(65) Prior Publication Data

US 2023/0086525 A1    Mar. 23, 2023

(51) Int. Cl.
*H01H 47/00* (2006.01)
*G01R 31/327* (2006.01)

(52) U.S. Cl.
CPC ....... *H01H 47/002* (2013.01); *G01R 31/3278* (2013.01); *H01H 47/001* (2013.01)

(58) Field of Classification Search
CPC .......................... H01H 47/002; G01R 31/3278
See application file for complete search history.

(56) References Cited

U.S. PATENT DOCUMENTS

| | | | | |
|---|---|---|---|---|
| 5,444,342 A | * | 8/1995 | Matsuo | B25J 9/1674 318/563 |
| 5,903,123 A | * | 5/1999 | Shimogama | B25J 19/06 318/563 |
| 7,525,273 B2 | * | 4/2009 | Hashimoto | H01H 47/002 318/563 |
| 2002/0195883 A1 | | 12/2002 | Lazzaro | |
| 2021/0173538 A1 | | 6/2021 | Henke et al. | |

FOREIGN PATENT DOCUMENTS

| | | |
|---|---|---|
| CN | 101427335 B | 12/2011 |
| CN | 109216113 A | 1/2019 |
| DE | 10146753 C | 4/2003 |
| DE | 102018209114 B | 3/2019 |
| EP | 1228519 B | 5/2004 |
| TW | M472196 U | 2/2014 |

\* cited by examiner

*Primary Examiner* — Walter L Lindsay, Jr.
*Assistant Examiner* — Milton Gonzalez
(74) *Attorney, Agent, or Firm* — Muncy, Geissler, Olds & Lowe, P.C.

(57) ABSTRACT

The relay safety system provided by the present invention includes a relay, an emergency stop device, a trigger detection circuit, a sticking detection circuit, and a power-off circuit. The emergency stop device is used to generate an emergency stop signal. The trigger detection circuit connects the relay and the emergency stop device, and is used to convert the emergency stop signal into a trigger signal. The sticking detection circuit is connected to the trigger detection circuit and the relay, and is used to detect the sticking signal generated by the relay, and generate a power-off signal according to the trigger signal and the sticking signal. The power-off circuit is connected to the emergency stop device, the relay and the sticking detection circuit, and receives the power-off signal, and disconnects the power of the relay according to the power-off signal.

9 Claims, 2 Drawing Sheets

RELAY SAFETY SYSTEM AND ROBOTIC ARM CONTROLLER

BACKGROUND OF THE INVENTION

1. Field of the Invention

The present invention relates to a controller of an electromechanical device and more particularly, to a robot arm controller and a relay safety system.

2. Description of the Related Art

Relay is widely used in the field of automatic control, such as robotic arms, mechanical equipment or other electromechanical equipment. However, the mechanical contact of the relay will cause the normally open contact and the common contact to bond together with the temperature and electrical conditions used, and form a state of stickiness or dead suction.

Taiwan Patent No. M472196 discloses a relay contact failure detection system, which triggers the control system to issue an alarm through the design of the control loop unit, and does not allow the control system to be restarted. Another embodiment is to cut off the protection loop unit Turn on the power of the internal control low-voltage source. Another embodiment is to cut off the power of the internal control low-voltage source through the protection circuit unit. Therefore, the patent needs to detect the status of the relay at any time, and cut off the operation of the high-voltage voltage source by cutting off the transmission of the internal control low-voltage source, and cannot separately cut off the transmission path of the internal control low-voltage source and the high-voltage voltage source. However, when one of the two relays has a contact abnormality, an alarm is issued to prohibit the next start, and the power of the relays cannot be directly disconnected. In addition, if the two relays are abnormal at the same time, the patent does not give a solution.

Chinese Patent No. CN101427335 discloses a power control device and a relay abnormal detection method, which judges the status of the relay through the charging plan of the capacitive element.

Chinese Patent No. CN109216113A discloses a relay device, which sets a control unit inside the relay, which comprises a fault detection unit and a switching control unit. In this way, the relay structure needs to be redesigned and due to the addition of the control unit, the volume should be larger than the general relay, which is not conducive to installation in a controller with a limited space.

SUMMARY OF THE INVENTION

The present invention has been accomplished under the circumstances in view. It is the main object of the present invention to provide a relay safety system and a robotic arm controller using the relay safety system, which can disconnect the relevant power supply of the relay when the relay has an abnormal contact, so as to improve the safety of the relay.

Therefore, a relay safety system provided by the present invention comprises a relay, an emergency stop device, a trigger detection circuit, a sticking detection circuit and a power-off circuit. The emergency stop device is used to generate an emergency stop signal. The trigger detection circuit connects the relay and the emergency stop device, and is used to convert the emergency stop signal into a trigger signal. The sticking detection circuit is connected to the trigger detection circuit and the relay, and is used to detect the sticking signal generated by the relay, and generate a power-off signal according to the trigger signal and the sticking signal. The power-off circuit is connected to the emergency stop device, the relay and the sticking detection circuit, and receives the power-off signal, and disconnects the power of the relay according to the power-off signal.

The present invention provides a robotic arm controller, comprising the said relay safety system.

In this way, the relay safety system and the robotic arm controller using the relay safety system of the present invention can use the emergency stop signal generated by the emergency stop device to allow the trigger detection circuit to drive the sticking detection circuit to determine whether the sticking abnormality has occurred in the relay. When the sticking abnormality has occurred, disconnect the relevant power supply of the relay through the power-off circuit to improve the safety and the reliability of the relay.

The detailed structure, characteristics and manufacturing method of the relay safety system will be explained in the following preferred embodiment. However, it should be understood that the preferred embodiments and drawings described below are only illustrative, and should not be used to limit the scope of the patent application of the present invention.

DETAILED DESCRIPTION OF THE INVENTION

In the following, the technical content and features of the present invention will be described in detail with several examples listed in conjunction with the drawings. The terms "connected" or "electrically connected" mentioned in the content of this specification are only for normal electrical conduction or connection. The terminology is not intended to limit the scope of the claim. In addition, the adjective terms of the level of electrical signals such as "high input" or "low input", "high output" or "low output" mentioned in the specification are only exemplary description terms based on the normal formation of the level of the electrical signal, and are not intended to limit the scope of the claim.

Figure 1:
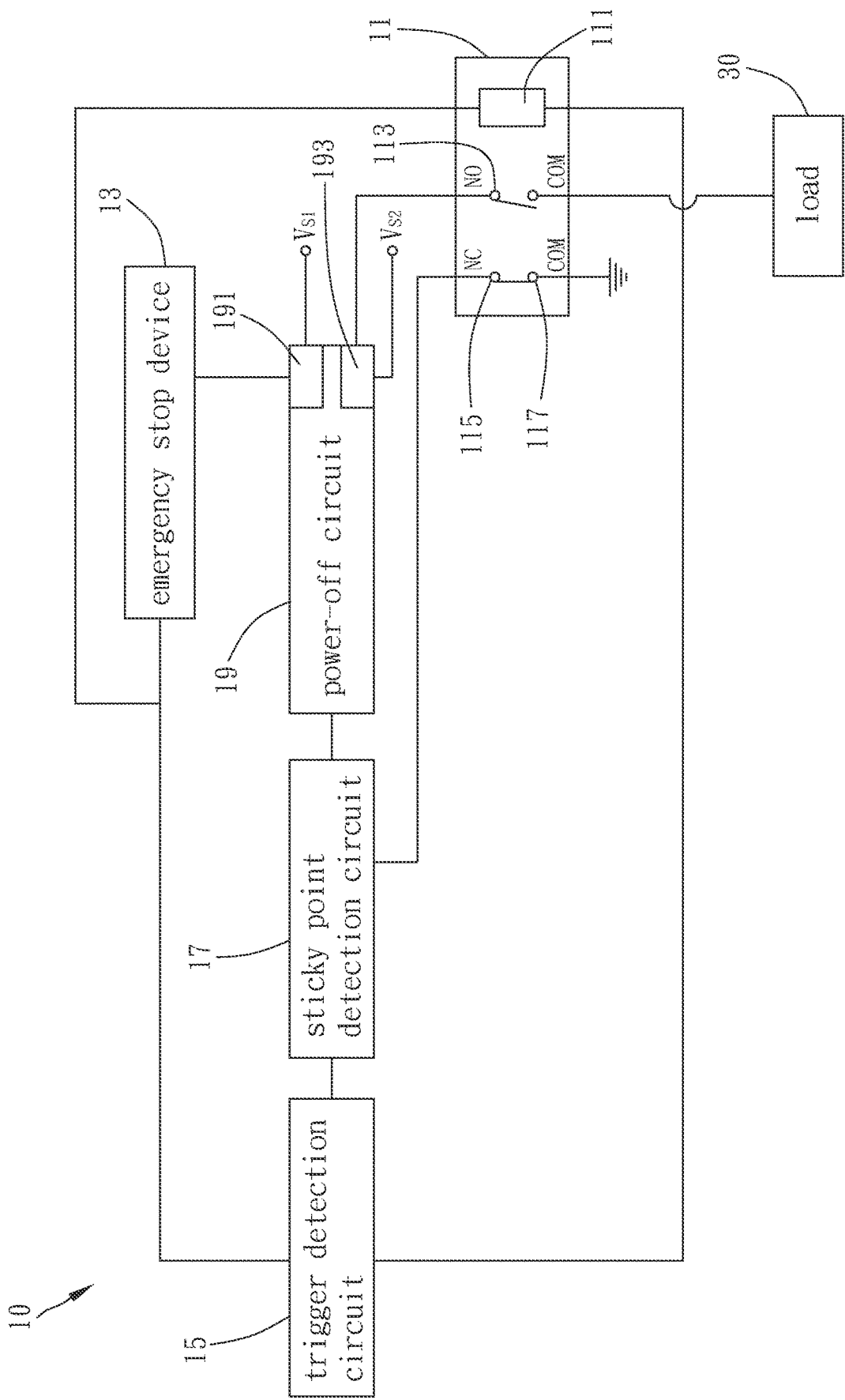
FIG. 1 is a block diagram of the relay safety system of the present invention.

In order to illustrate the technical features of the present invention in detail, the following preferred embodiments are given in conjunction with the drawings to illustrate the following, where:

As shown in FIG. 1, the relay safety system 10 of the present invention is applied to a robotic arm controller, or other environments that require a relay.

The relay safety system 10 comprises a relay 11, an emergency stop device 13, a trigger detection circuit 15, a sticking detection circuit 17 and a power-off circuit 19. The relay 11 comprises a coil 111, a normally open contact 113, a normally closed contact 115 and a common contact 117. The emergency stop device 13 is used to generate an emergency stop signal. The trigger detection circuit 15, the sticking detection circuit 17 and the power-off circuit 19 are set on a printed circuit board (not shown).

The trigger detection circuit 15 connects the coil 111 of the relay 11 and the emergency stop device 13, and is used to receive the emergency stop signal. The sticking detection circuit 17 is connected to the trigger detection circuit 15 and the normally closed contact 115 of the relay 11, and is used to generate a power-off signal according to the emergency stop signal and the contact signal of the relay 11. The power-off circuit 19 connects the sticking detection circuit 17, the relay 11 and the emergency stop device 13, and disconnects the power of relay 11 according to the power-off signal.

In normal power supply operation, the relay 11 can supply power to the load by conducting the normally open contact 113 and the common contact 117. At this time, the normally closed contact 115 and the common contact 117 are disconnected. When the power is off under normal conditions, the normally closed contact 115 and common contact 117 of the relay 11 are connected, and the normally open contact 113 and the common contact 117 are disconnected. Therefore, it is not possible to supply power to the load 30. The load 30 can be the motors or other circuits of the robotic arm controller.

When the relay 11 is found to be abnormal, the normally open contact 113 and common contact 117 of the relay 11 are both connected, that is, the normally open contact 113 and the common contact 117 are sucked or stuck. Similarly, the normally closed contact 115 and the common contact 117 are not connected, so the relay 11 will not be able to effectively turn off the power supplied to the load.

In this abnormal situation, the present invention detects the state of the emergency stop signal through the trigger detection circuit 15. When trigger detection circuit 15 detects the emergency stop signal, the trigger detection circuit 15 converts the emergency stop signal to a trigger signal to transmit the trigger signal to the sticking detection circuit 17. The sticking detection circuit 17 operates according to the trigger signal to detect the contact status of the relay 11.

In this embodiment, the sticking detection circuit 17 detects the operating state of the normally closed contact 115. When there is an emergency stop signal and the normally closed contact 115 and the common contact 117 are disconnected, it means that the normally open contact of the relay has an abnormal state of suction or sticking. Subsequently, the sticking detection circuit 17 generates a power-off signal, and the power-off circuit 19 disconnects the power of the relay 11 according to the power-off signal for inspection and maintenance.

In addition, when there is an emergency stop signal, but the normally closed contact 115 and the common contact 117 are connected, it means that the relay 11 is still normal.

In this embodiment, the power-off circuit 19 comprises a first switch unit 191 and a second switch unit 193. The first switch unit 191 is connected to a first voltage source $V_{S1}$ and the emergency stop device 13, and is used to disconnect the power to the emergency stop device 13 according to the power-off signal. The second switch unit 193 is connected to a second voltage source $V_{S2}$ and the normally open contact 113, and is used to disconnect the power to the normally open contact 113 of the relay 11 according to the power-off signal, and disconnect the related power of the relay 11 to achieve the purpose of power-off.

Continuing the aforementioned normal state, when the sticking detection circuit 17 detects that the normally closed contact 115 and the common contact 117 are disconnected, it means that the suction or sticking state has been released. Therefore, the relay 11 is normal and does not generate power-off signal.

Figure 2:
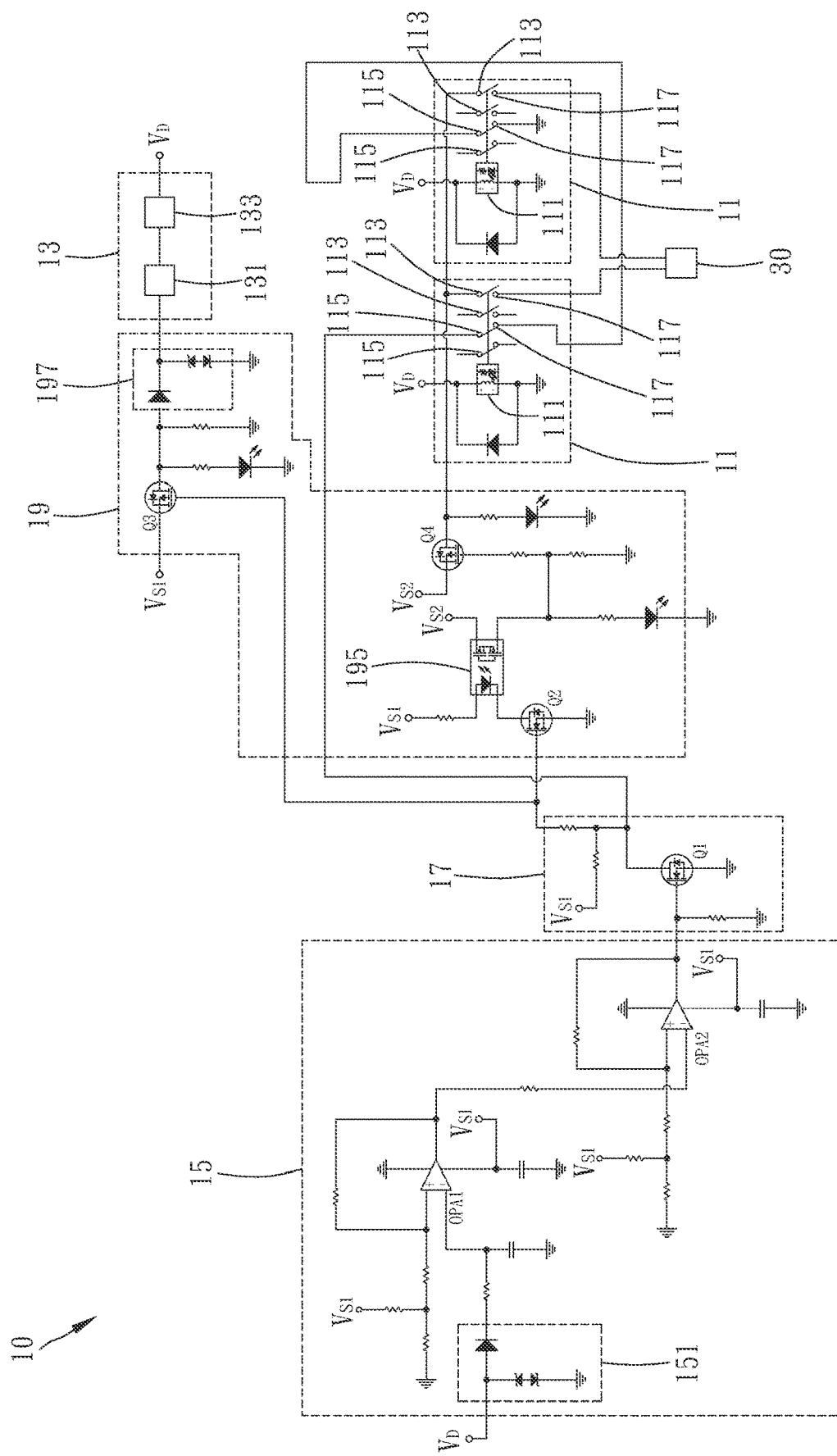
FIG. 2 is a hardware circuit diagram of the relay safety system in continuation of FIG. 1

As shown in FIG. 2, FIG. 2 is a continuation of the embodiment of FIG. 1, but the difference lies in the application of two relays 11. In other words, in other embodiments, the number of relays can be more, such as three or more.

The emergency stop device 13 comprises a fuse 131 and an emergency stop switch unit 133 connected to the fuse 131. The emergency stop switch unit 133 is used to actuate or trigger to generate an emergency stop signal. However, in other embodiments, the emergency stop device 13 can also generate an emergency stop signal through other components or electronic circuits.

The trigger detection circuit 15 comprises an input protection unit 151, a first operational amplifier OPA1, and a second operational amplifier OPA2. The sticking detection circuit 17 comprises a first N-channel transistor (N-MOSFET) Q1 and operates according to the trigger signal. The power-off circuit 19 comprises an optocoupler 195, a second N-channel transistor Q2, a first P-channel transistor (P-MOSFET) Q3, a second P-channel transistor Q4, and an output protection unit 197. The first switch unit 191 and the second switch unit 193 are the first P-channel transistor Q3 and the second P-channel transistor Q4, respectively.

The input protection unit 151 is electrically connected to the output terminal $V_D$ of the emergency stop device 13 (that is, the emergency stop switch unit 133 of the emergency stop device 13) and the inverting input terminal of the first operational amplifier OPA1. The positive input terminal of the first operational amplifier OPA1 is electrically connected to the first voltage source $V_{S1}$. The output terminal of the first operational amplifier OPA1 is electrically connected to the inverting input terminal of the second operational amplifier OPA2. The positive input terminal of the second operational amplifier OPA2 is electrically connected to the first voltage source $V_{S1}$. The output terminal of the second operational amplifier OPA2 is electrically connected to the gate of the first N-channel transistor Q1. The source of the first N-channel transistor Q1 is connected to ground. The drain of the first N-channel transistor Q1 is electrically connected to the normally closed contact 115 of the relay, the first voltage source $V_{S1}$, the gate of the second N-channel transistor Q2, and the gate of the first P-channel transistor Q3. The source of the second N-channel transistor Q2 is electrically connected to the ground terminal. The source of the first P-channel transistor Q3 is electrically connected to the first voltage source $V_{S1}$. The output protection unit 197 is electrically connected to the drain of the first P-channel transistor Q3 and the input terminal of the emergency stop device 13, that is, the fuse 131 of the emergency stop device 13. The primary side of optocoupler 195 is electrically connected to the first voltage source $V_{S1}$ and the drain of second N-channel transistor Q2. The secondary side of optocoupler 195 is electrically connected to the second voltage source $V_{S2}$ and the gate of the second P-channel transistor Q4. The source of the second P-channel transistor Q4 is electrically connected to the second voltage source $V_{S2}$. The drain of the second P-channel transistor Q4 is electrically connected to the normally open contact 113 of the relay 11. The output terminal $V_D$ of the emergency stop device 13 is electrically connected to the coil 111 of the relay 11.

In this embodiment, the input protection unit 151 and the output protection unit 197 are the same composition, and the composition comprises a diode and a transient conduction diode. In this way, by setting the input protection unit 151 and output protection unit 197 to avoid damage to the power supply system (i.e., the power supply environment of the second voltage source $V_{S2}$ and the first voltage source $V_{S1}$) caused by the second voltage source $V_{S2}$ and first voltage source $V_{S1}$ wiring errors.

In general or normal power supply conditions, the normally open contact 113 of the relay 11 is connected to the common contact 117, and the normally closed contact 115 is open, and power is allowed to be supplied to the load. At this time, when the emergency stop device 13 is not activated or triggered, the emergency stop device 13 provides high output to the inverting input terminal of the first operational amplifier OPA1, and the output terminal of the first operational amplifier OPA1 is low output, and the output of the second operational amplifier OPA2 is High output. In this way, the first N-channel transistor Q1 is in the turn on state, that is, the drain-source of the first N-channel transistor Q1 is connected, and the drain of the first N-channel transistor Q1 is low output. At this time, the gates of the second N-channel transistor Q2, the first P-channel transistor Q3, and second P-channel transistor Q4 are low input, so that second N-channel transistor Q2 is turned off state, and the first P-channel transistor Q3 and second P-channel transistor Q4 are turned on, and power is continuously supplied to the relay 11.

When the emergency stop device 13 is activated or triggered, the emergency stop device 13 provides low output to the inverting input terminal of the first operational amplifier OPA1, and the output terminal of the first operational amplifier OPA1 is high output, and the output of the second operational amplifier OPA2 is low output, so that the first N-channel transistor Q1 is turned off, and the normally closed contact 115 of the relay 11 is connected to the common contact 117, that is, the relay 11 is normal. Therefore, the first P-channel transistor Q3 and the second P-channel transistor Q4 are in turned on, and the relay can continue to be powered.

When the emergency stop device 13 is activated or triggered, the emergency stop device 13 provides low output to the inverting input terminal of the first operational amplifier OPA1, and the output terminal of the first operational amplifier OPA1 is high output, and the output of the second operational amplifier OPA2 is low output, so that the first N-channel transistor Q1 is turned off, and the normally closed contact 115 of the relay 11 is not connected to the common contact 117, it means that normally open contact 113 and common contact 117 may have sticky points, that is, relay 11 is abnormal. At this time, the gates of the first P-channel transistor Q3 and the second N-channel transistor Q2 are high input, and the second N-channel transistor Q2 is turned on, causing the optocoupler 195 to operate, so that the gate of the second P-channel transistor Q4 is high input, and the first P-channel transistor Q3 and second P-channel transistor Q4 are in the turn off (or non-conducting) state to disconnect the transmission path of the second voltage source $V_{S2}$ and the first voltage source $V_{S1}$.

The optocoupler 195 in the power-off circuit 19 is used to control the gate voltage of the second P-channel transistor Q4 through the first voltage source $V_{S1}$, so that the power-off circuit 19 can effectively and synchronously switch the first P-channel transistor Q3 and the second P-channel transistor Q4. In addition, the optocoupler 195 can effectively isolate the first voltage source $V_{S1}$ and the second voltage source $V_{S2}$ to prevent the first voltage source $V_{S1}$ and the second voltage source $V_{S2}$ from affecting each other.

In this way, the relay safety system of the present invention can give an emergency stop request through the emergency stop signal of the emergency stop device, and use the trigger detection circuit and the sticking detection circuit to confirm whether the relay is abnormal, that is, the sticking problem, and when the abnormality exists, the power-off circuit is used to disconnect all the related power supplies of the relay. The robotic arm controller can disconnect the power of the relay through the relay safety system to repair, maintain or replace the relay.

Through the foregoing embodiments, it is illustrated that those skilled in the art can understand the technology and purpose of the hardware configuration of the relay safety system of the present invention. Therefore, the above configuration of operational amplifiers and transistors (including N-channel transistors or P-channel transistors) can also be changed in the hardware through the number or arrangement of logic components to achieve the same technology and purpose. Therefore, the operational amplifiers and transistors described in the embodiments are only the descriptions in this embodiment, and are not intended to limit the scope of claims.

What is claimed is:

1. A relay safety system, comprising:
   a relay;
   an emergency stop device adapted to generate an emergency stop signal;
   a trigger detection circuit connecting said relay and said emergency stop device and adapted to convert said emergency stop signal into a trigger signal;
   a sticking detection circuit connected to said trigger detection circuit and said relay, and adapted to detect a sticking signal generated by said relay, and generate a power-off signal according to said trigger signal and said sticking signal; and
   a power-off circuit connected to said emergency stop device, said relay and said sticking detection circuit, and adapted to receive said power-off signal and disconnect the power of said relay according to said power-off signal.

2. The relay safety system as claimed in claim 1, wherein said power-off circuit comprises a first switch unit and a second switch unit, said first switch unit being electrically connected to said emergency stop device and a first voltage source, said second switch unit being electrically connected to a normally open contact of said relay and a second voltage source, said power-off circuit controlling said first switch unit and said second switch unit to be in a turn off state according to said power-off signal.

3. The relay safety system as claimed in claim 2, wherein said power-off circuit further comprises an optocoupler and a transistor, said optocoupler having a primary side thereof electrically connected to said first voltage source and said transistor of said power-off circuit and a secondary side thereof electrically connected to said second voltage source and said second switch unit, said power-off circuit controlling said transistor of said power-off circuit to be in a turn on state according to said power-off signal.

4. The relay safety system as claimed in claim 3, wherein said sticking detection circuit comprises a transistor, which is connected to a normally closed contact of said relay, said trigger detection circuit and said power-off circuit, and is turned off according to said trigger signal.

5. The relay safety system as claimed in claim 4, wherein when said sticking detection circuit receives no trigger signal, said transistor of said sticking detection circuit is turned on.

6. The relay safety system as claimed in claim 2, wherein said power-off circuit comprises an output protection unit, which connects said first switch unit and said emergency stop device.

7. The relay safety system as claimed in claim 2, wherein said trigger detection circuit comprises a first operational amplifier and a second operational amplifier, said first operational amplifier having an inverting input terminal thereof electrically connected to said emergency stop device, said first operational amplifier having a positive input terminal thereof electrically connected to said first voltage source, said first operational amplifier having an output terminal thereof electrically connected to an inverting input terminal of said second operational amplifier, said second operational amplifier having a positive input terminal thereof electrically connected to said first voltage source, said second operational amplifier having an output terminal thereof electrically connected to said sticking detection circuit.

8. The relay safety system as claimed in claim 7, wherein said trigger detection circuit further comprises an input protection unit electrically connected to said emergency stop device and said inverting input terminal of said first operational amplifier.

9. A robotic arm controller, comprising a relay safety system as claimed in claim 1.

\* \* \* \* \*